(12) United States Patent
Yeh et al.

(10) Patent No.: US 6,929,989 B2
(45) Date of Patent: Aug. 16, 2005

(54) SEMICONDUCTOR DEVICE AND MANUFACTURING METHOD THEREOF

(75) Inventors: Fang-Yu Yeh, Taoyuan (TW); Chi Lin, Taipei (TW); Chuang-Hsiang Chen, Taipei (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/604,509

(22) Filed: Jul. 28, 2003

(65) Prior Publication Data

US 2004/0175876 A1 Sep. 9, 2004

(30) Foreign Application Priority Data

Mar. 3, 2003 (TW) ........................................ 92104352 A (51) Int. Cl.[7] .................... H01L 21/336; H01L 21/8234
(52) U.S. Cl. ...................................... 438/197; 438/524
(58) Field of Search ................................ 438/197, 303, 438/305, 320, 321, 524, 525

(56) References Cited

U.S. PATENT DOCUMENTS

| 5,677,228 A | * | 10/1997 | Tseng ........................ 438/238 |
| 6,046,108 A | * | 4/2000 | Liu et al. .................... 438/687 |
| 6,171,916 B1 | | 1/2001 | Sugawara et al. .......... 438/303 |
| 6,509,249 B1 | * | 1/2003 | Liu et al. .................... 438/424 |
| 6,765,252 B2 | * | 7/2004 | Nam .......................... 257/296 |

FOREIGN PATENT DOCUMENTS

JP 07-030104 1/1995

* cited by examiner

Primary Examiner—Phuc T. Dang
(74) Attorney, Agent, or Firm—Jiang Chyun IP Office (57) ABSTRACT

A method of manufacturing a semiconductor device is provided. First, a well region is formed in a substrate and then a mask layer is formed over the substrate. The mask layer and the substrate are patterned to form a first opening in the substrate. Thereafter, a threshold voltage adjustment process is performed. A gate dielectric layer, a first conductive layer and a second conductive layer are sequentially formed inside the first opening. The second conductive layer completely fills the first opening. A portion of the first conductive layer and the second conductive layer are removed so that the upper surface of the first conductive layer and the second conductive layer is slightly below the upper surface of the substrate and hence forms a second opening. A cap layer is formed in second opening and then the mask layer is removed. A source/drain region is formed in the substrate on each side of the first conductive layer. An inter-layer dielectric layer is formed over the substrate. Finally, using the cap layer as a self-aligned mask, a contact opening is formed in the inter-layer dielectric layer.

17 Claims, 13 Drawing Sheets

SEMICONDUCTOR DEVICE AND MANUFACTURING METHOD THEREOF

CROSS REFERENCE TO RELATED APPLICATIONS

This application claims the priority benefit of Taiwan application Ser. No. 92104352, filed Mar. 3, 2003.

BACKGROUND OF INVENTION

1. Field of Invention

The present invention relates to a method of manufacturing an integrated circuit. More particularly, the present invention relates to a semiconductor device and manufacturing method thereof.

2. Description of Related Art

In deep sub-micron integrated circuit manufacturing, the level of device integration has increased considerably. As the level of integration continues to increase, many features including contact area, junction depth and line width must be reduced correspondingly. To boost the performance capacity of such miniature devices, resistance must be reduced and resistance-capacitance (RC) delay in transmitted signals through a conductive wire must be lowered as much as possible. Therefore, a refractory metal silicide layer is often formed on the polysilicon layer of gate in the fabrication of the semiconductor devices. The composite layer comprising the polysilicon layer and the refractory metal silicide layer is referred to as a polycide gate. Among various types of refractory metal silicide compounds, tungsten silicide ($WSi_x$) is the most widely used one. The gate structure formed by joining a polysilicon layer and a tungsten silicide layer together is hence called a tungsten polycide gate. The following is a brief description of the conventional method of manufacturing a tungsten polycide gate.

Figure 1A:
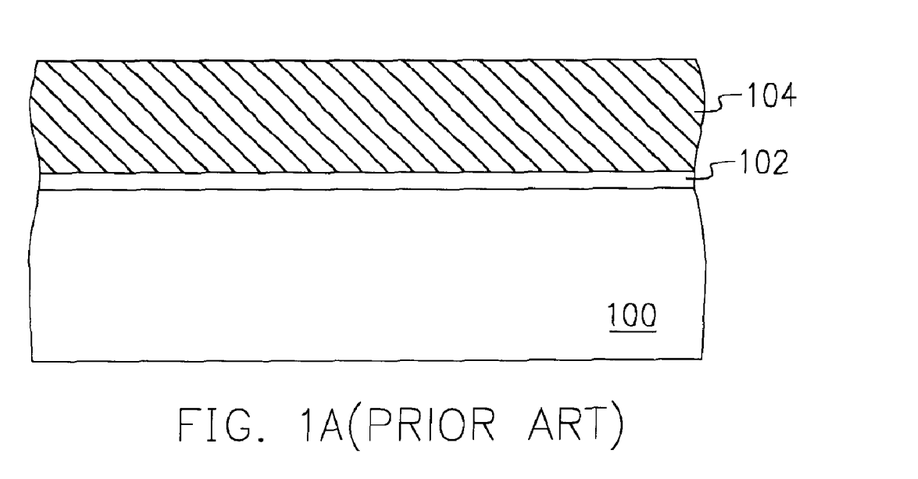
FIGS. 1A through 1D are schematic cross-sectional views showing the steps in a conventional method of fabricating a tungsten polycide gate.

FIGS. 1A through 1D are schematic cross-sectional views showing the steps in a conventional method of fabricating a tungsten polycide gate. First, as shown in FIG. 1A, a substrate 100 is provided. Thereafter, a gate dielectric layer 102 is formed over the substrate 100 and then a doped polysilicon layer 104 is formed over the gate dielectric layer 102.

Figure 1B:
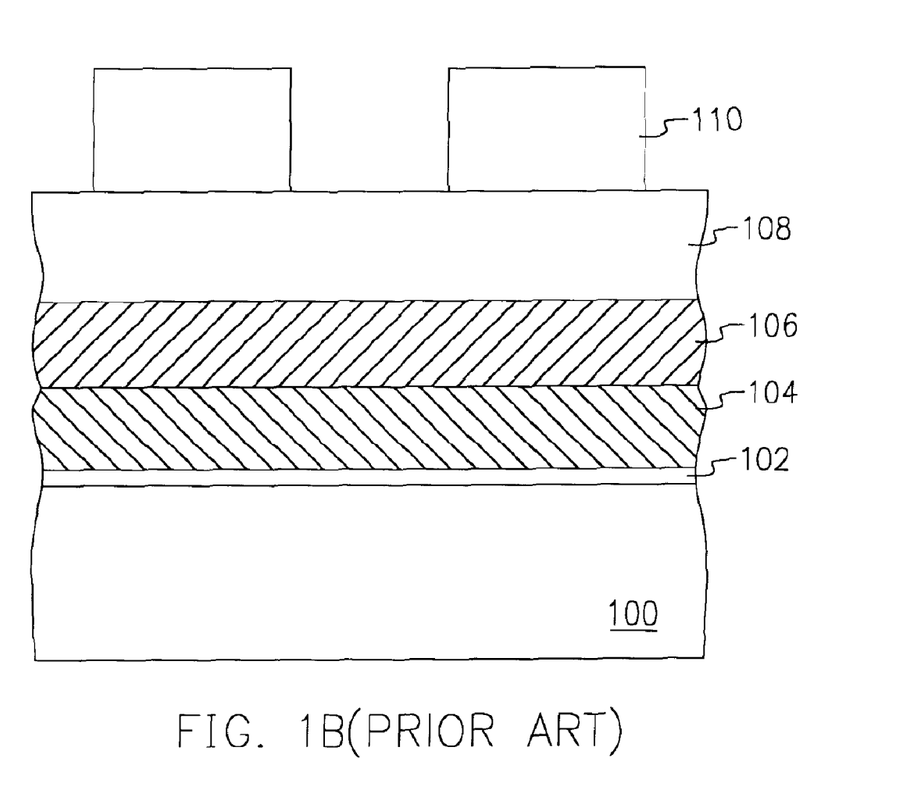

As shown in FIG. 1B, a tungsten-rich tungsten silicide (WSi, x<2.3) layer 106 is formed over the polysilicon layer 104. Thereafter, a cap layer 108, preferably a silicon nitride layer, is formed over the tungsten-rich tungsten silicide layer 106. A patterned photoresist layer 110 is formed over the cap layer 108.

Figure 1C:
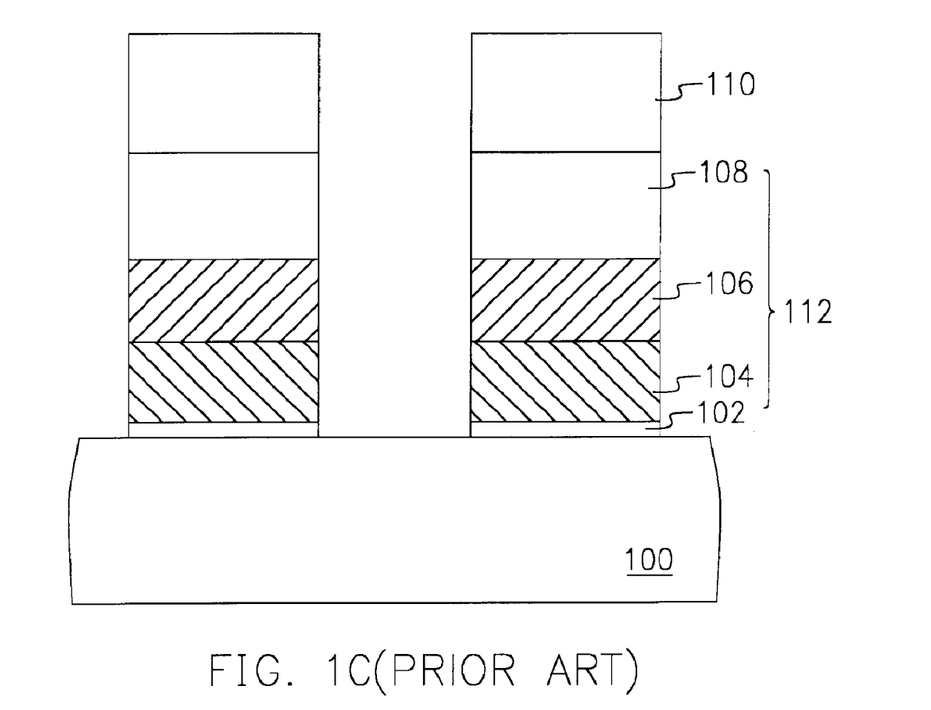

As shown in FIG. 1C, using the patterned photoresist layer 110 as a mask, the cap layer 108, the tungsten silicide layer 106, the polysilicon layer 104 and the gate oxide layer 102 are sequentially etched to form a stack gate structure 112.

Figure 1D:
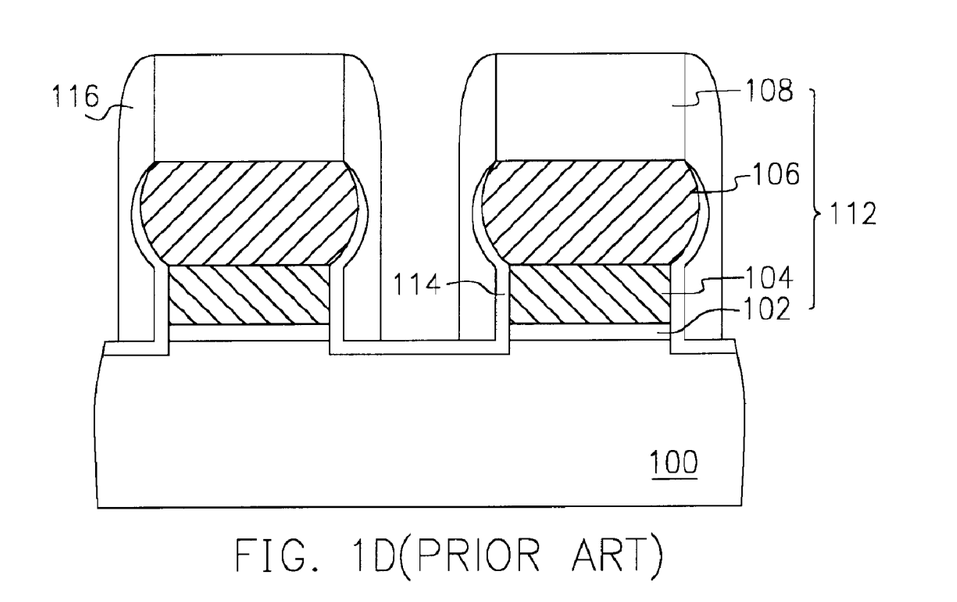

As shown in FIG. 1D, after the patterned photoresist layer 110 is removed, a thermal oxidation process is performed to form silicon oxide liners 114 on the sidewalls of the stack gate structure 112 and on the substrate 100. Thereafter, a silicon nitride protective wall layer 116 is formed on each side of the stack gate structure 112.

In the aforementioned method of fabricating the tungsten polycide gate, the tungsten silicide layer 106 will be exposed immediately after the formation of the stack gate structure 112. Hence, in the thermal oxidation step, the tungsten silicide in the tungsten silicide layer 106 will react with oxygen to form tungsten oxide. Furthermore, in a high-temperature processing environment during a thermal annealing or thermal oxidation operation, lateral extrusions (as shown in FIG. 1D) are often formed on the sides of the tungsten silicide layer 106 due to a phase transition. As line width of semiconductor devices continues to shrink, these lateral extrusions may be so close together that short-circuit between the gate and the conductive section of a subsequently formed contact seems inevitable. When this happens, performance of the device will be immensely affected.

One method of eliminating the lateral extrusions is to increase the silicon content of the tungsten silicide layer. In other words, a silicon-rich ($WSi_x$, x>2.3) tungsten silicide layer is formed in the fabrication process. However, increasing the silicon content in the tungsten silicide layer will increase gate resistance. To maintain a constant gate resistance, thickness of the tungsten silicide layer must be increased. Yet, increasing the thickness of the tungsten silicide layer will increase the aspect ratio of the gate leading to greater difficulties in performing a subsequent gate etching and self-aligned contact (SAC) etching process.

SUMMARY OF INVENTION

Accordingly, An object this invention is to provide a semiconductor device and manufacturing method thereof having a lower overall thermal budget.

An object of this invention is to provide a semiconductor device and manufacturing method thereof capable of producing an internal structure with a lower aspect ratio so that the process window for etching out contacts is increased.

An object of this invention is to provide a semiconductor device and manufacturing method thereof capable of producing a device with optimal short channel properties.

A object of this invention is to provide a semiconductor device and manufacturing method thereof capable of producing a device with optimal short channel properties.

To achieve these and other advantages and in accordance with the purpose of the invention, as embodied and broadly described herein, the invention provides a method of manufacturing a semiconductor device. First, a well region is formed in a substrate and then a mask layer is formed over the substrate. The mask layer and the substrate are patterned to form a first opening in the substrate. Thereafter, a threshold voltage adjustment process is performed. A gate dielectric layer is formed on the interior surface of the first opening. A first conductive layer and a second conductive layer are sequentially formed over the substrate with the second conductive layer completely filling the first opening. The first conductive layer and the second conductive layer outside the first opening are removed to expose the mask layer. Next, a portion of the first conductive layer and the second conductive layer are removed so that the upper surface of the first conductive layer and the second conductive layer is slightly below the upper surface of the substrate and hence form a second opening. A cap layer is formed in the second opening and then the mask layer is removed. A source/drain region is formed in the substrate on each side of the first conductive layer. An inter-layer dielectric layer is formed over the substrate. Using the cap layer as a self-aligned mask, a contact opening is formed in the inter-layer dielectric layer.

The aforementioned manufacturing method, after forming a mask layer over the substrate, furthermore includes forming a bottom anti-reflection layer over the mask layer. Furthermore, the step of patterning the mask layer and the substrate to form the first opening includes patterning the bottom anti-reflection layer as well. The first conductive layer is fabricated using doped polysilicon and the second conductive layer is fabricated using refractory metal silicide compound. Moreover, the mask layer is fabricated using a material having an etching selectivity that differs from the first conductive layer, the second conductive layer and the cap layer.

In this invention, the doped polysilicon layer and the refractory metal silicide layer are formed within the substrate with the doped polysilicon layer enclosing the refractory metal silicide layer. With this structural setup, lateral outgrowth on the sidewalls due to oxidation of the refractory metal silicide is prevented. Hence, tungsten-rich tungsten silicide can be used to reduce resistance and improve device performance.

Furthermore, with both the doped polysilicon layer and the refractory metal silicide layer enclosed inside the substrate, no additional silicon nitride layer for protecting the sidewalls is required. Without the protective silicon nitride layer, aspect ratio of the contact opening is reduced so that the process window for performing the self-aligned contact process is increased.

In addition, by adjusting the implant depth in the source/drain region, channel length or shallow junction effect can be increased.

This invention also provides an alternative method of manufacturing a semiconductor device. First, a well region is formed in a substrate and then a mask layer is formed over the substrate. The mask layer and the substrate are patterned to form an opening in the substrate. A threshold voltage adjustment operation is carried out. A gate dielectric layer is formed on the interior surface above the substrate. A polysilicon layer and a refractory metal silicide layer are sequentially formed over the substrate such that the refractory metal silicide layer completely fills the opening. Thereafter, the polysilicon layer and the refractory metal silicide layer outside the opening are removed to expose the mask layer. A portion of the polysilicon layer and the refractory metal silicide layer is removed so that the upper surface of the polysilicon layer and the refractory metal silicide layer is slightly below the upper surface of the substrate. Hence, a polycide gate structure is formed inside the substrate. Next, a cap layer is formed inside the opening. The mask layer is removed and then a source/drain region is formed in the substrate on each side of the polycide gate structure.

The aforementioned manufacturing method, after forming a mask layer over the substrate, furthermore includes forming a bottom anti-reflection layer over the mask layer. Furthermore, the step of patterning the mask layer and the substrate to form the opening includes patterning the bottom anti-reflection layer as well. The first conductive layer is fabricated using doped polysilicon and the second conductive layer is fabricated using refractory metal silicide compound. Moreover, the mask layer is fabricated using a material having an etching selectivity that differs from the first conductive layer, the second conductive layer and the cap layer.

In this invention, the doped polysilicon layer and the refractory metal silicide layer are formed within the substrate with the doped polysilicon layer enclosing the refractory metal silicide layer. With this structural setup, lateral outgrowth on the sidewalls due to oxidation of the refractory metal silicide is prevented. Hence, tungsten-rich tungsten silicide can be used to reduce resistance and improve device performance.

Furthermore, with both the doped polysilicon layer and the refractory metal silicide layer enclosed inside the substrate, no additional silicon nitride layer for protecting the sidewalls is required. Without the protective silicon nitride layer, aspect ratio of the contact opening is reduced so that the process window for performing the self-aligned contact process is increased.

In addition, by adjusting the implant depth in the source/drain region, channel length or shallow junction effect can be increased.

This invention also provides a semiconductor device. The device comprises a substrate with an opening therein, a dielectric layer within the opening, a first conductive layer over the dielectric layer, a second conductive layer over the first conductive layer that fills the opening, a cap layer over the first conductive layer and the second conductive layer and a source/drain region in the substrate on each side of the first conductive layer.

In the aforementioned semiconductor device structure, the second conductive layer is a refractory metal silicide layer and the first conductive layer is a doped polysilicon. The doped polysilicon layer and the refractory metal silicide layer are formed inside the substrate with the doped polysilicon layer enclosing the refractory metal silicide layer. This prevents the formation of any lateral extrusions from the sidewalls of the refractory metal silicide layer. Hence, a tungsten-rich tungsten silicide material can be used to fabricate the refractory metal silicide layer so that the electrical resistance of the device is lowered and performance of the device is improved.

Furthermore, with both the doped polysilicon layer and the refractory metal silicide layer enclosed inside the substrate, no additional silicon nitride layer for protecting the sidewalls is required. Without the protective silicon nitride layer, aspect ratio of the contact opening is reduced so that the process window for performing the self-aligned contact process is increased.

In addition, by adjusting the implant depth in the source/drain region, channel length or shallow junction effect can be increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A through 2I are schematic cross-sectional views showing the steps for fabricating a semiconductor device according to first preferred embodiment of this invention.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 2A:
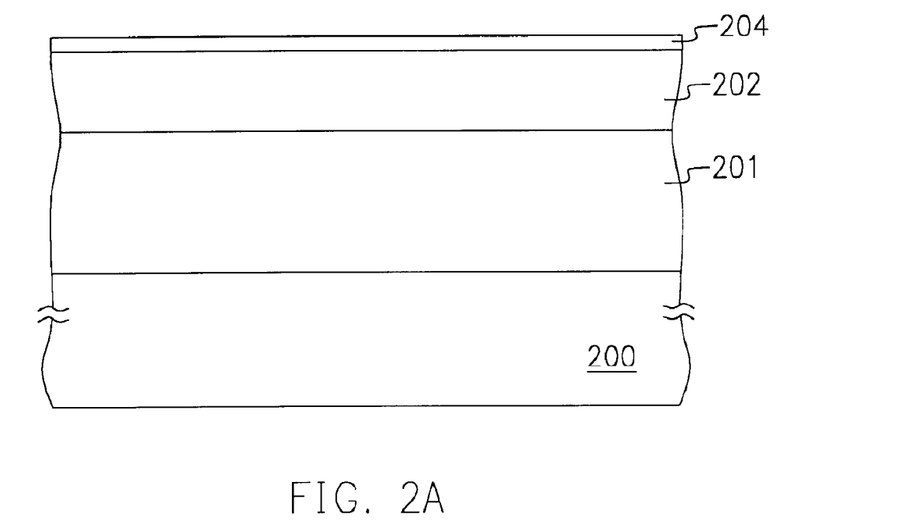

FIGS. 2A through 2I are schematic cross-sectional views showing the steps for fabricating a semiconductor device according to first preferred embodiment of this invention. First, as shown in FIG. 2A, a substrate 200 such as a silicon substrate is provided. The substrate 200 has a well region 201 formed, for example, by implanting dopants into the substrate 200 followed by performing a thermal treatment. Thereafter, a mask layer 202 and a bottom anti-reflection layer 204 are sequentially formed over the substrate 200. The mask layer 202 is fabricated using a material having an etching selectivity that differs from a subsequently formed doped polysilicon layer, refractory metal silicide layer and cap layer. The mask layer 202 is a silicon dioxide layer or silicon oxide layer formed, for example, by performing a chemical vapor deposition process using tetra-ethyl-orthosilicate (TEOS)/ozone ($O_3$) mixture as a gaseous reactant. The bottom anti-reflection layer 204 is a silicon oxy-nitride ($SiO_xN_y$) layer formed, for example, by performing a plasma-enhanced chemical vapor deposition (PECVD) process.

Figure 2B:
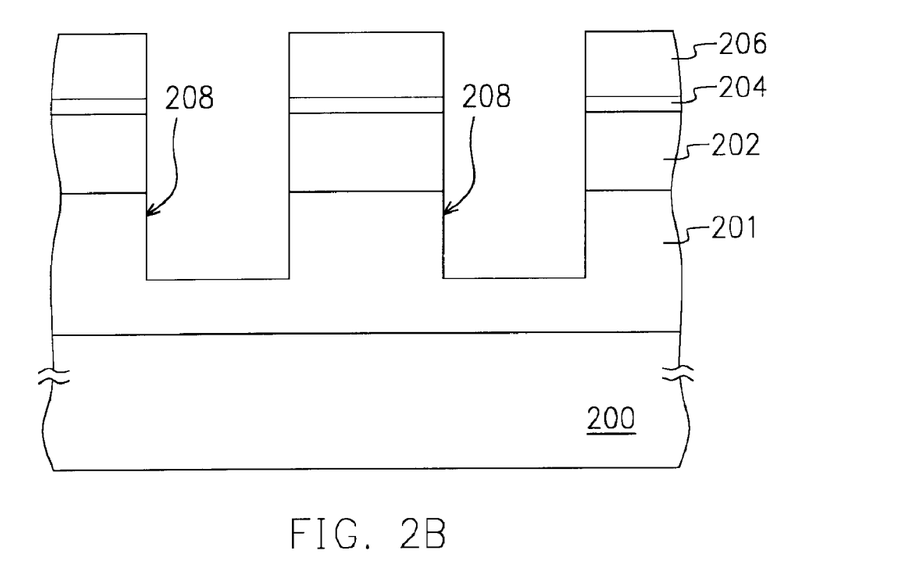

As shown in FIG. 2B, a patterned photoresist layer 206 is formed over the bottom anti-reflection layer 204. Thereafter, using the patterned photoresist layer 206 as a mask, the bottom anti-reflection layer 206, the mask layer 202 and a portion of the substrate 200 are sequentially etched to form an opening 208 in the substrate 200. The opening 208 in the substrate 200 is formed, for example, by performing a dry etching process such as reactive ion etching to the bottom anti-reflection layer 204, the mask layer 202 and the substrate 200.

Figure 2C:
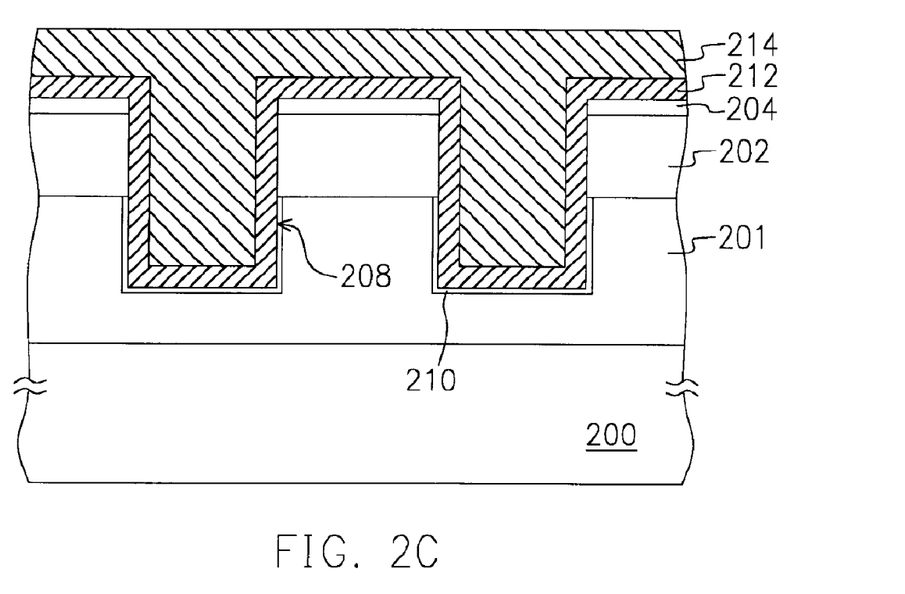

As shown in FIG. 2C, the patterned photoresist layer 206 is removed. A wet cleaning process is performed to remove any residual material at the bottom of the opening 208 above the substrate 200. In the wet cleaning process, cleaning agents such as sulfuric acid/hydrogen peroxide mixture and diluted hydrofluoric acid solution is used.

A threshold voltage adjustment step is carried out so that a subsequently formed semiconductor device has a desired threshold voltage. The threshold voltage is set, for example, by implanting dopants into the substrate 200 at the bottom of the opening 208. Thereafter, a gate dielectric layer 210 is formed on the interior surface of the opening 208 above the substrate 200. The gate dielectric layer 210 is a silicon oxide layer formed, for example, by performing a thermal oxidation process. Obviously, the gate dielectric layer can also be fabricated using other dielectric materials including, for example, silicon oxy-nitride and silicon nitride.

A conductive layer 212 is formed over the substrate 200 without completely filling the opening 208. The conductive layer 212 is a doped polysilicon layer formed, for example, by performing a low-pressure chemical vapor deposition process. Thereafter, another conductive layer 214 is formed over the conductive layer 212 such that the opening 208 is completely filled. The conductive layer 214 is formed, for example, by performing a low-pressure chemical vapor deposition process. The conductive layer 214 is fabricated using a refractory metal silicide compound including, for example, tungsten silicide, nickel silicide, cobalt silicide, titanium silicide, molybdenum silicide, platinum silicide or palladium silicide. In this embodiment, the refractory metal silicide is fabricated using tungsten-rich tungsten silicide ($WSi_x$, x<2.3).

Figure 2D:
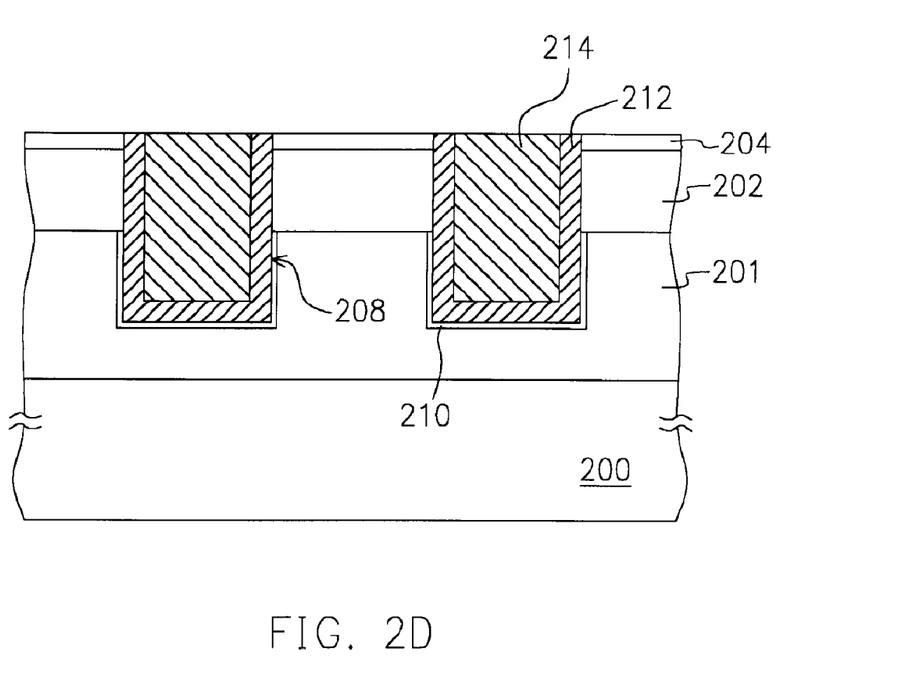

As shown in FIG. 2D, the conductive layers 212 and 214 outside the opening 208 are removed, for example, by performing a chemical-mechanical polishing process so that the bottom anti-reflection layer 204 is exposed.

Figure 2E:
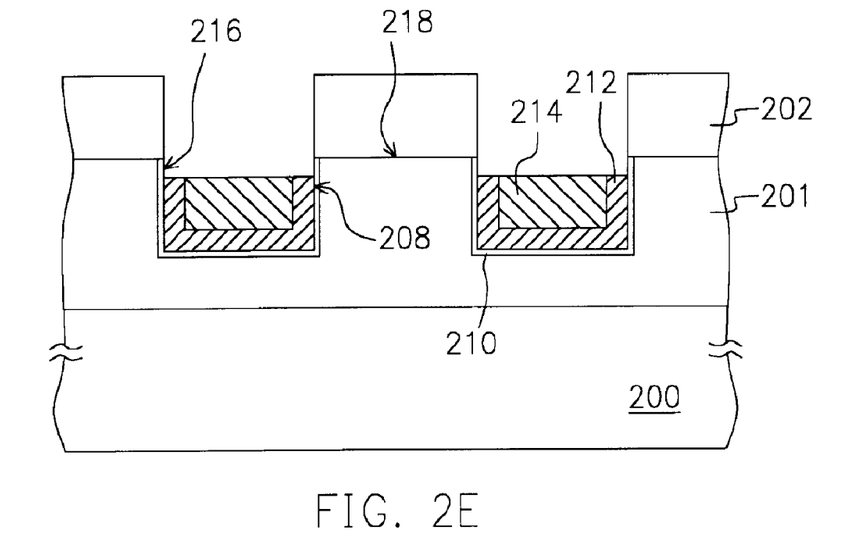

As shown in FIG. 2E, the conductive layers 212 and 214 inside the opening 208 are etched back so that the upper surface of the conductive layers 212 and 214 is at a level slightly below the upper surface 218 of the substrate 200. In other words, an opening 216 is formed in the substrate 200. However, according to actual requirement, the upper surface of the conductive layers 212 and 214 can be fabricated to the same level as the upper surface 218 of the substrate 200. After etching back the conductive layers 212 and 214, the bottom anti-reflection layer 204 is also removed.

Figure 2F:
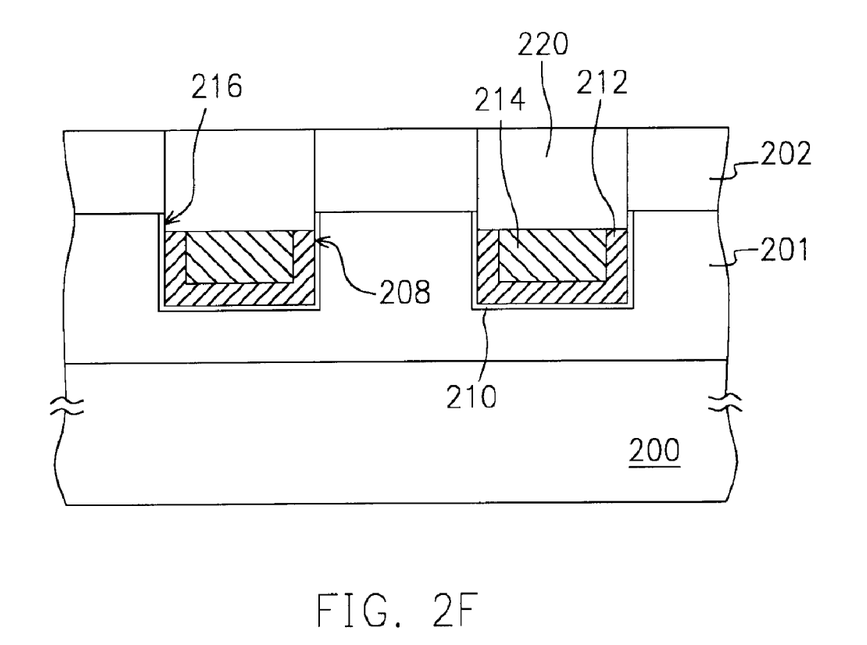

As shown in FIG. 2F, thereafter, a cap layer 220 is formed inside the opening 216. The cap layer 220 is a silicon nitride layer formed, for example, by performing a chemical vapor deposition process to form a silicon nitride layer and then performing a chemical-mechanical polishing process to remove silicon nitride material outside the opening 216 and expose the mask layer 202.

Figure 2G:
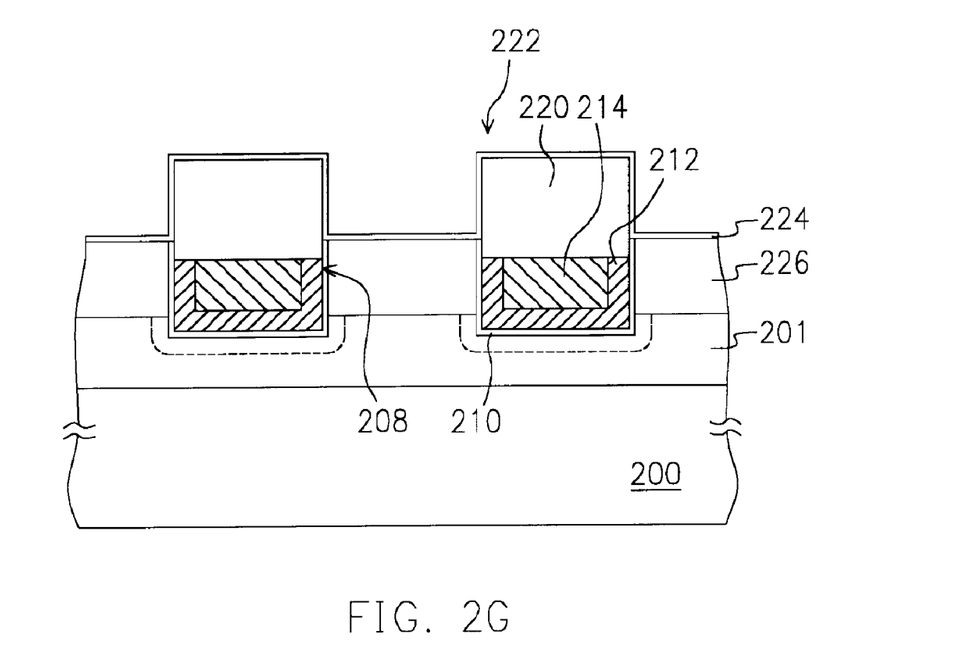

As shown in FIG. 2G, the mask layer 202 above the substrate 200 is removed to form a gate structure 222. The gate structure 222 comprises the gate dielectric layer 210, the conductive layers 212, 214 and the cap layer 220. The mask layer 202 is removed, for example, by wet etching using a buffered oxide etchant (BOE) such a mixture of hydrofluoric acid (HF) and ammonium fluoride ($NH_4F$). Thereafter, a liner layer 224 is formed over the substrate 200. The liner layer 224 is a silicon oxy-nitride layer formed, for example, by performing a low-pressure chemical vapor deposition process.

Next, an ion implantation is carried out to form a source/drain region 226 in the substrate 200 on each side of the gate structure 222. In the implantation process, when the dosage and energy level of the implant is small, the source/drain region 226 will have a shallower depth. Hence, by adjusting the implant parameters, the length of the channel between the source region and the drain region can be increased (the dash pathway in FIG. 2G). On the other hand, when the dosage and energy level of the implant is large, the source/drain region 226 has a greater depth. When the depth of the source/drain region 226 is below the bottom section of the opening 208, the source/drain region 226 below the opening 208 may serve as the actual source/drain region while the source/drain region 226 above the opening 208 may serve as a contact. In this way, a shallow junction source/drain region is formed leading to an improved device performance.

Figure 2H:
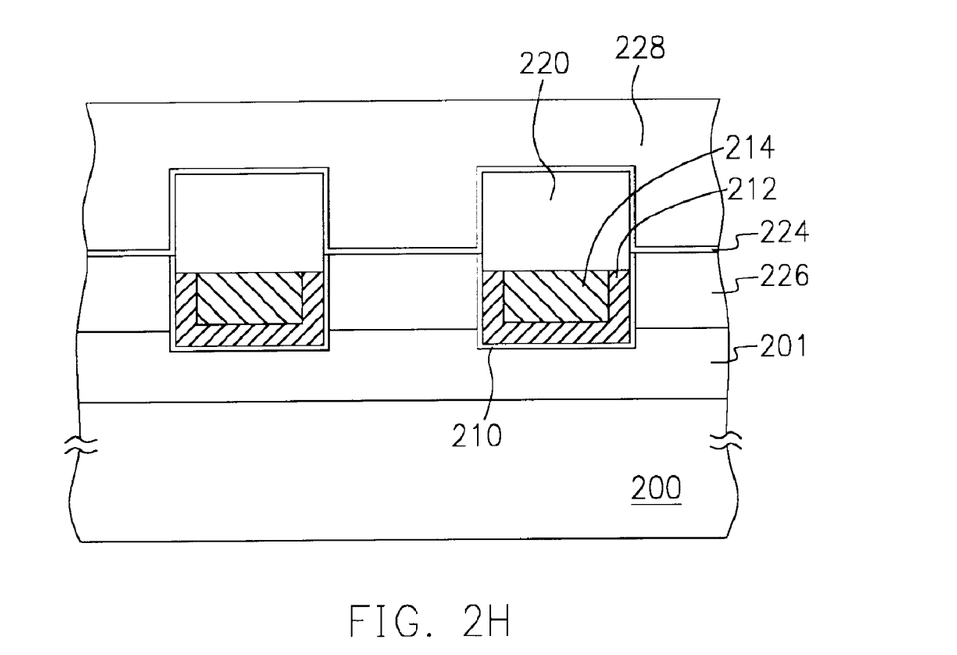

As shown in FIG. 2H, an inter-layer dielectric layer 228 is formed over the substrate 200. The inter-layer dielectric layer 228 is a silicon dioxide layer formed, for example, by performing a chemical vapor deposition process.

As shown in FIG. 2I, a patterned photoresist layer (not shown) is formed over the inter-layer dielectric layer 228. Using the patterned photoresist layer as a mask and the cap layer 220 as a self-aligned mask, a portion of the inter-layer dielectric layer 228 is removed to form a contact opening 230. The contact opening 230 exposes the source/drain region 226. Thereafter, other processes necessary for completing the fabrication of the semiconductor device such as forming the contacts are carried out. Since conventional techniques are used in these remaining processes, detailed description is omitted.

In the aforementioned method, the refractory metal silicide layer (the conductive layer 214) such as the tungsten silicide layer is enclosed by the doped polysilicon layer (the conductive layer 212). This prevents the tungsten suicide layer (the refractory metal silicide layer) from reacting with oxygen to produce lateral extrusions at the sidewalls of the layer. Hence, the gate structure has a straight profile so that the process window for etching the self-aligned contact is improved. Furthermore, tungsten-rich tungsten silicide material can be used to form the refractory metal silicide layer. Thus, electrical resistance of the metal silicide layer is reduced and performance of the semiconductor device is improved.

In addition, the conductive layers 212 and 214 are entirely enclosed within the opening 208 of the substrate 200. Hence, the height of the gate structure 222 above the upper surface 218 of the substrate 200 is greatly reduced. In other words, the subsequently formed contact opening 230 has a low aspect ratio so that the process window for carrying out the self-aligned contact etching is increased. Furthermore, because the conductive layers 212 and 214 are buried inside the substrate, etchant for etching out the contact opening 230 will not get to the conductive layers 212 and 214. Therefore, there is no need to fabricate protective silicon nitride layers on the sidewalls of the conductive layers 212 and 214. Again, this will enhance the process window in the self-aligned contact etching process.

The method of manufacturing the semiconductor device according to this invention also permits the adjustment of the depth of the source/drain region 226 by setting the dosage and energy level in an ion implantation. Hence, the channel length or the shallow junction area can be increased according to the actual requirement to improve device performance.

Although the aforementioned embodiment illustrates the fabrication of a gate structure, gate structures are by no means the only structure that can be manufactured by the invention. The method can be applied to fabricate other semiconductor devices including, for example, the word lines of a memory device, the gates of a memory device, metal-oxide-semiconductor (MOS) transistors and metallic interconnects.

Figure 3:
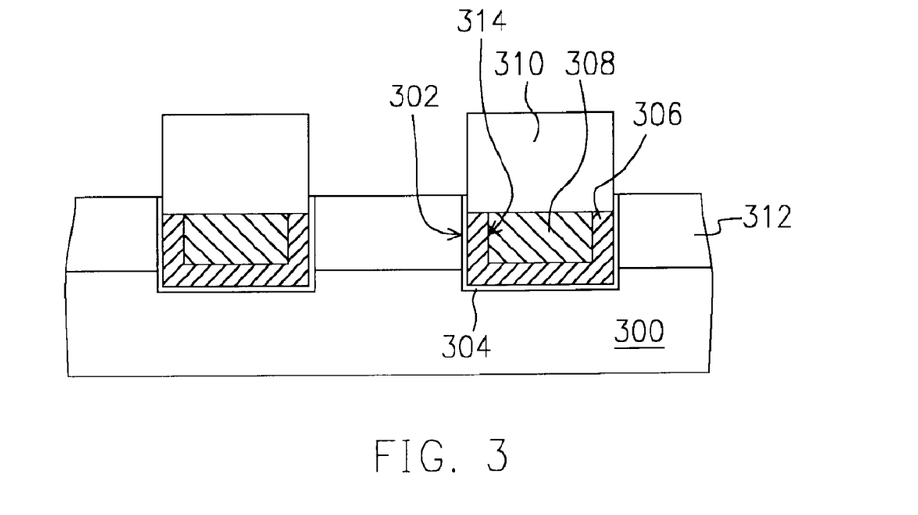
FIG. 3 is a schematic cross-sectional view of a semiconductor device structure according to a first preferred embodiment of this invention.

FIG. 3 is a schematic cross-sectional view of a semiconductor device structure according to a first preferred embodiment of this invention. As shown in FIG. 3, the semiconductor device structure comprises a substrate 300 with an opening 302 therein, a dielectric layer 304, a first conductive layer 306, a second conductive layer 308, a cap layer 310 and a source/drain region 312.

The dielectric layer 304 is formed on the interior sidewalls of the opening 302 within the substrate 300 and fabricated using silicon oxide or silicon oxy-nitride, for example. The conductive layer 306 is formed over the dielectric layer 304 inside the opening 302 and fabricated using doped polysilicon, for example. The conductive layer 306 has a U-shaped cross-sectional profile surrounding a central opening 314. The conductive layer 308 is formed inside the opening 314 created by the conductive layer 306. The conductive layer 308 is fabricated using refractory metal silicide including, for example, tungsten silicide, nickel silicide, cobalt silicide, titanium silicide, molybdenum silicide, platinum silicide or palladium silicide. The cap layer 310 is formed over the conductive layer 306 and the conductive layer 308 and fabricated using silicon nitride, for example. The source/drain region 312 is formed in the substrate 300 on each side of the conductive layer 306 such that the junction of the source/drain region 312 is at a level above the bottom section of the opening 302.

Figure 4:
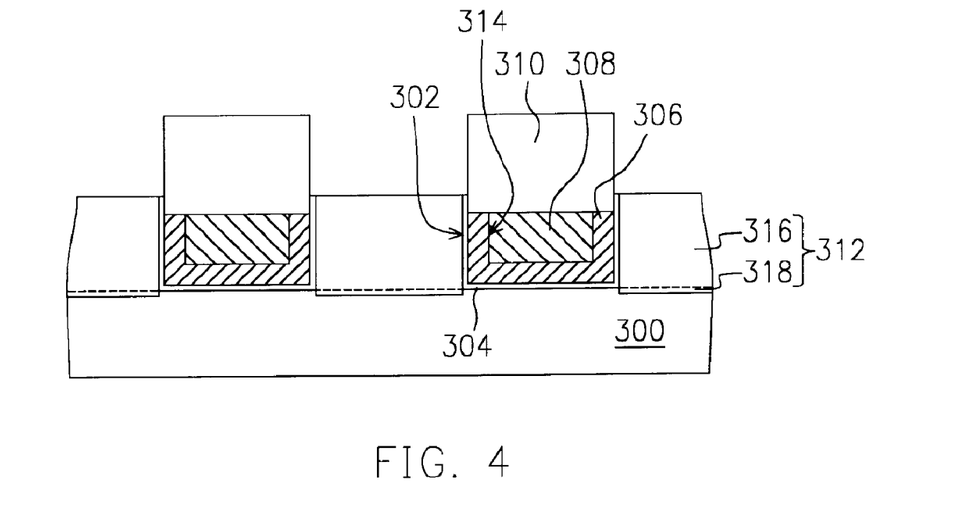
FIG. 4 is a schematic cross-sectional view of a semiconductor device structure according to a second preferred embodiment of this invention.

FIG. 4 is a schematic cross-sectional view of another semiconductor device structure according to the first preferred embodiment of this invention. In FIG. 4, elements identical to the ones in FIG. 3 are labeled identically. The only difference from the semiconductor device in FIG. 3 is that the junction of the source/drain region 312 is at a level below the bottom section of the opening 302. Therefore, the source/drain region 312 is divided into a contact region 316 and a source/drain shallow junction region 318. Through dosage adjustment in the ion implant process, thickness of the source/drain shallow junction region 318 can be reduced to obtain an optimal shallow junction effect and improve device performance.

In the aforementioned semiconductor device structure, the doped polysilicon layer (the conductive layer 306) and the refractory metal silicide layer (the conductive layer 308) are formed inside the substrate with the doped polysilicon layer enclosing the refractory metal silicide layer. Hence, there is no need to form a protective silicon nitride covering the refractory metal silicide layer. Furthermore, the tungsten silicide layer (the conductive layer 308) is prevented from contacting oxygen at a high temperature to produce lateral outgrowth from the sidewalls. Thus, the conductive stack structure can have a straight profile and hence increase the process window for performing the self-aligned contact etching. Moreover, with the doped polysilicon layer enclosure, a tungsten-rich tungsten silicide can be used to fabricate the refractory metal silicide layer and lower the electrical resistance of the device.

Furthermore, the depth of the source/drain region can be adjusted to increase the channel length or to enhance the shallow junction effect. Since the doped polysilicon layer (the conductive layer 306) and the refractory metal silicide layer (the conductive layer 308) are formed inside the substrate, aspect ratio of the semiconductor device can be reduced so that the process window for performing the self-aligned contact etching process is increased.

Obviously, the refractory metal silicide layer (the conductive layer 308) may protrude above the opening 314 in the polysilicon layer (the conductive layer 306). In other words, the sidewalls of the refractory metal silicide layer (the conductive layer 308) are not entirely enclosed by the polysilicon layer (the conductive layer 306) so that the upper portion of the sidewalls of the refractory metal silicide layer is enclosed by the cap layer 310. The cap layer 310 is fabricated using a material such as silicon nitride. Since silicon nitride compound has an etching selectivity that differs from most material constituting the inter-layer dielectric layer such as silicon oxide or borophosphosilicate glass, the cap layer 310 can serve as an etching stop layer in the self-aligned contact process. Moreover, with the conductive layer 308 buried inside the substrate 300, short-circuit between the gate and the conductive section of the contact is prevented.

Figure 5A:
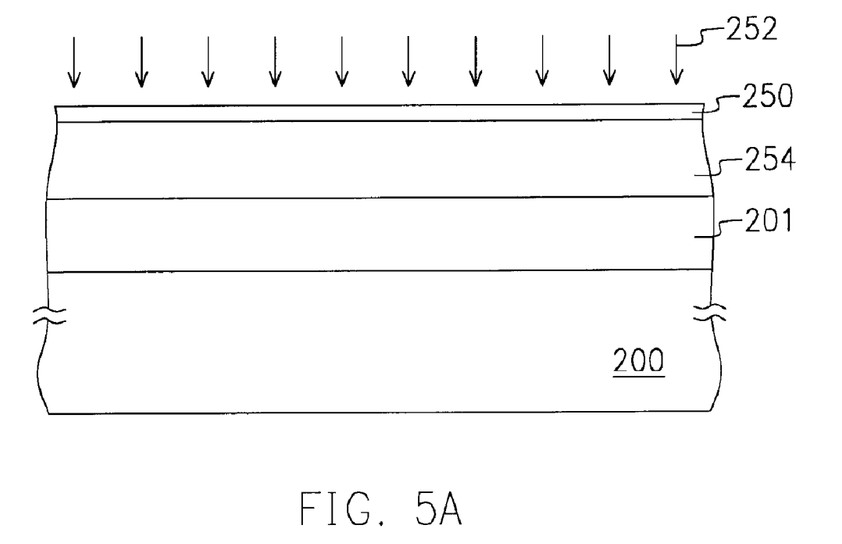
FIGS. 5A through 5J are schematic cross-sectional views showing the steps for fabricating a semiconductor device according to second preferred embodiment of this invention.

FIGS. 5A through 5J are schematic cross-sectional views showing the steps for fabricating a semiconductor device according to a second preferred embodiment of this invention. First, as shown in FIG. 5A, a substrate 200 such as a silicon substrate is provided. A sacrificial oxide layer 250 such as a silicon dioxide layer or silicon oxide layer is formed on the substrate 200. A well region 201 is formed in the substrate by performing an ion implantation and a thermal treatment using a patterned photoresist layer as a mask layer (not shown) formed on the substrate 200. Thereafter, an ion implantation 252 is carried out using the mask layer as a mask (not shown) for forming the well to form a source/drain region 254 in the substrate 200. In the implantation process, when the dosage and energy level of the implant is small, the source/drain region 226 will have a shallower depth. On the other hand, when the dosage and energy level of the implant is large, the source/drain region 226 has a greater depth.

Figure 5B:
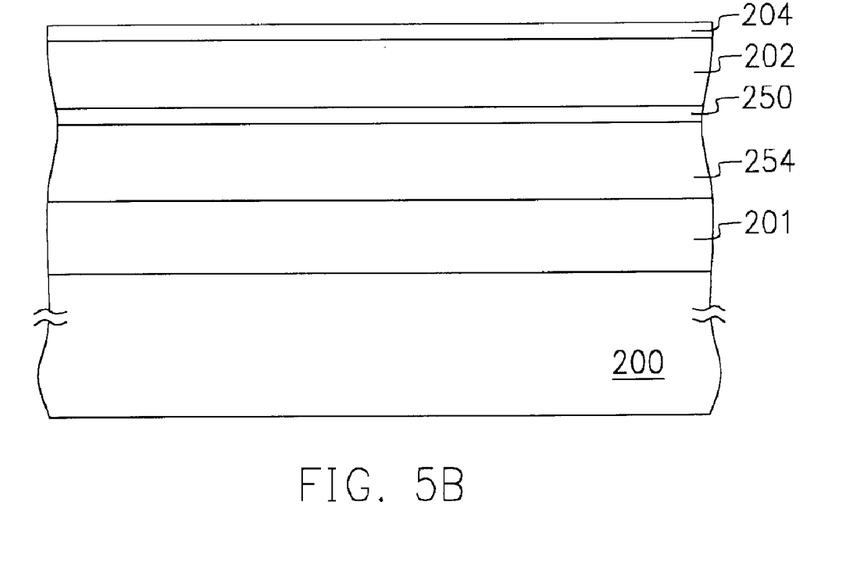

As shown in FIG. 5B, the patterned photoresist layer is removed, and then a mask layer 202 and a bottom anti-reflection layer 204 are sequentially formed over the substrate 200. The mask layer 202 is formed using a material having an etching selectivity that differs from a subsequently formed doped polysilicon layer, refractory metal silicide layer and cap layer. The mask layer 202 is a silicon dioxide layer or silicon oxide layer formed, for example, by performing a chemical vapor deposition process using tetra-ethyl-ortho-silicate (TEOS)/ozone ($O_3$) mixture as a gaseous reactant. The bottom anti-reflection layer 204 is a silicon oxy-nitride ($SiO_xN_y$) layer formed, for example, by performing a plasma-enhanced chemical vapor deposition (PECVD) process.

Figure 5C:
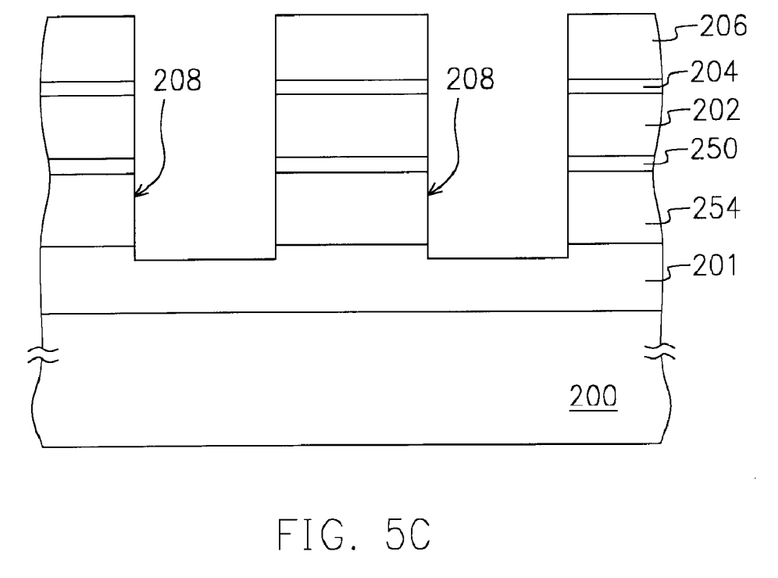

As shown in FIG. 5C, a patterned photoresist layer 206 is formed over the bottom anti-reflection layer 204. Thereafter, using the patterned photoresist layer 206 as a mask, exposed portions of the bottom anti-reflection layer 206, the mask layer 202 and the substrate 200 are sequentially etched to form an opening 208. The opening 208 is formed, for example, by performing a dry etching process such as reactive ion etching. Even though the FIG. 5C shows that the bottom section of the opening is in an upper portion of the source/drain region 254, however, the bottom section of the opening 208 can be below or above the source/drain region 254. When the depth of the source/drain region 254 is below the bottom section of the opening 208, the source/drain region 254 may serve as the actual source/drain region, while the source/drain region 226 above the opening 208 may serve as a contact. In this way, a shallow junction source/drain region is formed leading to an improved device performance.

Figure 5D:
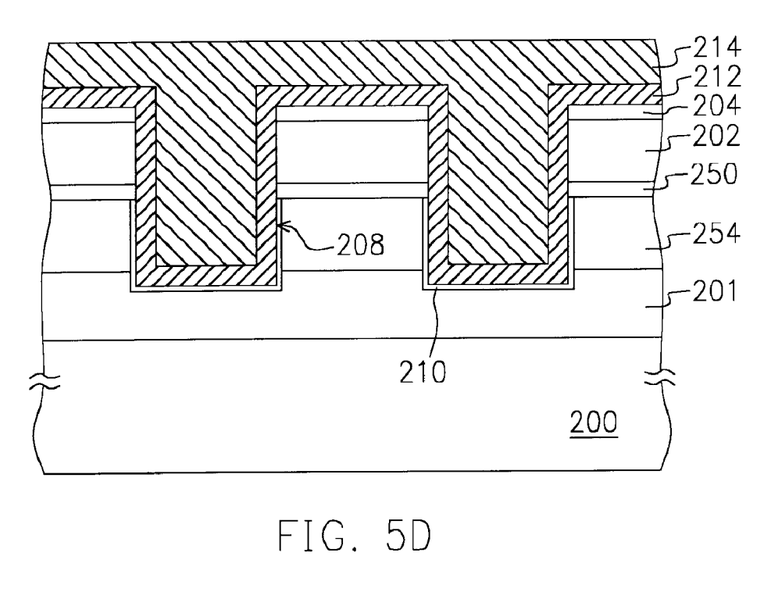

As shown in FIG. 5D, the patterned photoresist layer 206 is removed. A wet cleaning process is performed to remove any residual material at the bottom of the opening 208 above the substrate 200. In the wet cleaning process, cleaning agents such as sulfuric acid/hydrogen peroxide mixture and diluted hydrofluoric acid solution is used.

A threshold voltage adjustment step is carried out so that a subsequently formed semiconductor device has a desired threshold voltage. The threshold voltage is set, for example, by implanting dopants into the substrate 200 at the bottom of the opening 208. Thereafter, a gate dielectric layer 210 is formed on the interior surface of the opening 208 above the substrate 200. The gate dielectric layer 210 is a silicon oxide layer formed, for example, by performing a thermal oxidation process. Obviously, the gate dielectric layer 210 can also be fabricated using other dielectric materials including, for example, silicon oxy-nitride and silicon nitride.

A conductive layer 212 is formed over the substrate 200 without completely filling the opening 208. The conductive layer 212 is a doped polysilicon layer formed, for example, by performing a low-pressure chemical vapor deposition process. Thereafter, another conductive layer 214 is formed over the conductive layer 212 such that the opening 208 is completely filled. The conductive layer 214 is formed, for example, by performing a low-pressure chemical vapor deposition process. The conductive layer 214 is fabricated using a refractory metal silicide compound including, for example, tungsten silicide, nickel silicide, cobalt silicide, titanium silicide, molybdenum silicide, platinum silicide or palladium silicide. In this embodiment, the refractory metal silicide is fabricated using tungsten-rich tungsten silicide ($WSi_x$, x<2.3).

Figure 5E:
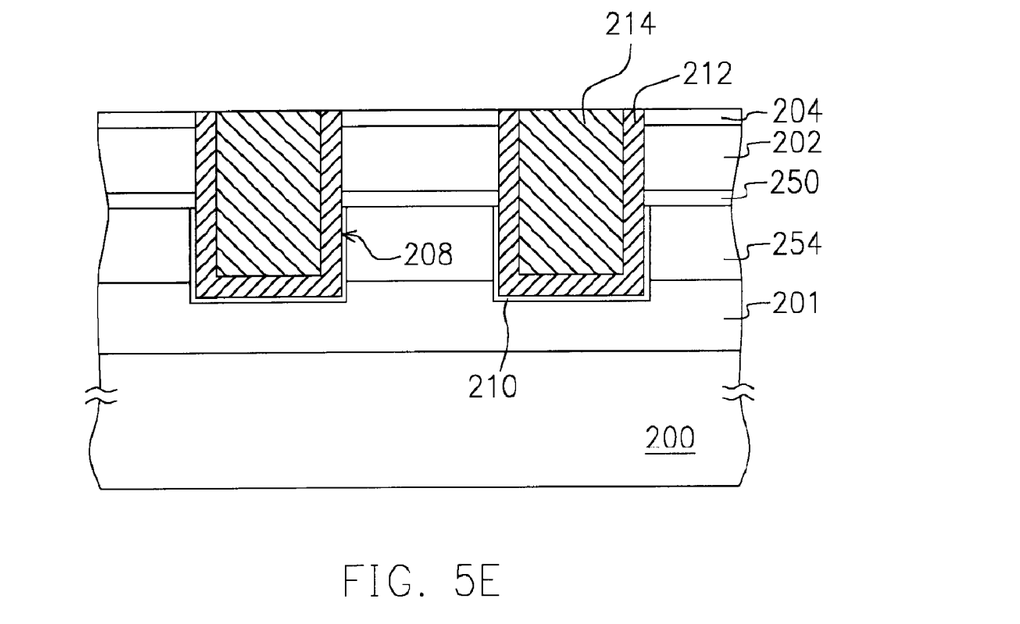

As shown in FIG. 5E, portions of the conductive layers 212 and 214 outside the opening 208 are removed, for example, by performing a chemical-mechanical polishing process so that the bottom anti-reflection layer 204 is exposed.

Figure 5F:
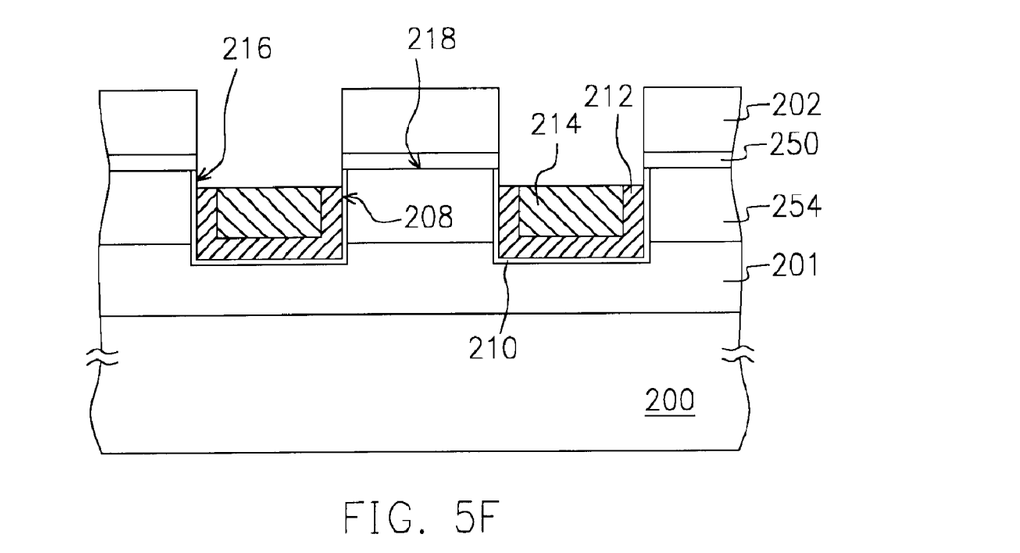

As shown in FIG. 5F, the conductive layers 212 and 214 inside the opening 208 are etched back so that the upper surface of the conductive layers 212 and 214 is at a level slightly below the upper surface 218 of the substrate 200. In other words, an opening 216 is formed in the substrate 200. However, according to actual requirement, the upper surface of the conductive layers 212 and 214 can be fabricated to the same level as the upper surface 218 of the substrate 200. After etching back the conductive layers 212 and 214, the bottom anti-reflection layer 204 is also removed.

Figure 5G:
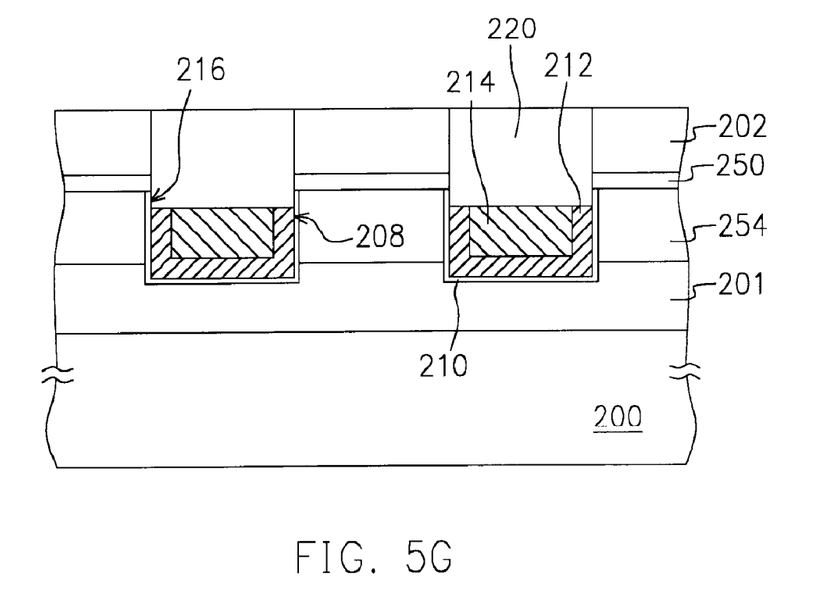

As shown in FIG. 5G, thereafter, a cap layer 220 is formed inside the opening 216. The cap layer 220 is a silicon nitride layer formed, for example, by performing a chemical vapor deposition process and then performing a chemical-mechanical polishing process to remove the silicon nitride material outside the opening 216 and expose the mask layer 202.

Figure 5H:
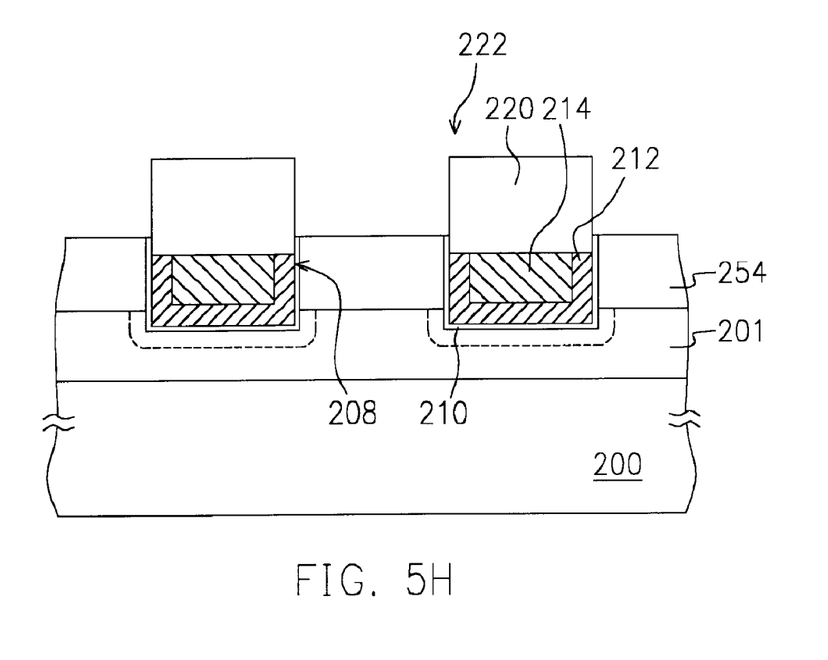

As shown in FIG. 5H, the mask layer 202 and the sacrificial oxide layer 250 are removed to form a gate structure 222. The gate structure 222 comprises the gate dielectric layer 210, the conductive layers 212, 214 and the cap layer 220. The mask layer 202 is removed, for example, by wet etching using a buffered oxide etchant (BOE) such as a mixture of hydrofluoric acid (HF) and ammonium fluoride ($NH_4F$).

Figure 5I:
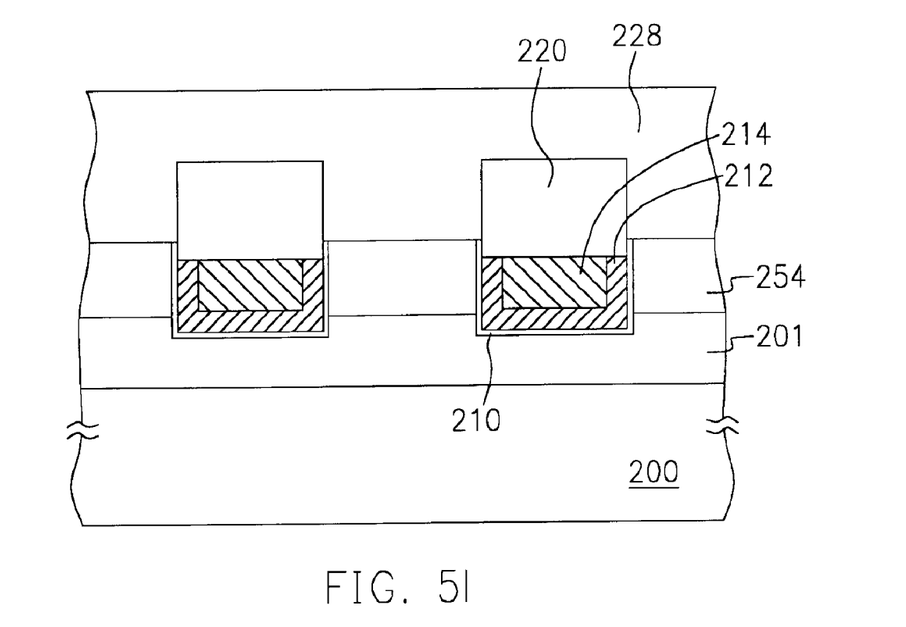

Next, as shown in FIG. 5I, an inter-layer dielectric layer 228 is formed over the substrate 200. The inter-layer dielectric layer 228 is a silicon dioxide layer formed, for example, by performing a chemical vapor deposition process.

Figure 5J:
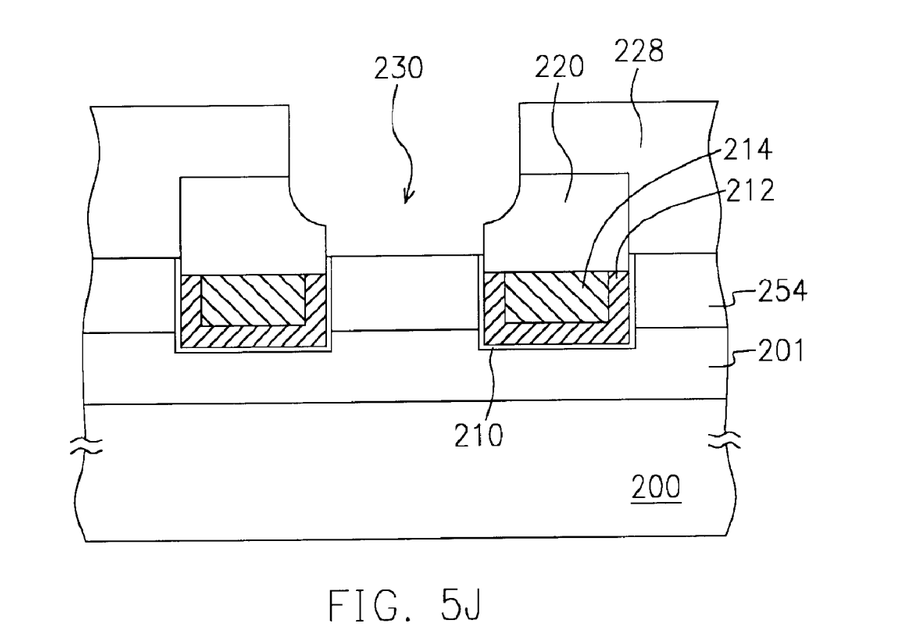

As shown in FIG. 5J, a patterned photoresist layer (not shown) is formed over the inter-layer dielectric layer 228. Using the patterned photoresist layer as a mask and the cap layer 220 as a self-aligned mask, a portion of the inter-layer dielectric layer 228 is removed to form a contact opening 230. The contact opening 230 exposes the source/drain region 254. Thereafter, other processes necessary for completing the fabrication of the semiconductor device such as forming the contacts are carried out. Since conventional techniques are used in these remaining processes, detailed description is omitted.

The second embodiment of this invention also has the advantages of the first embodiment, and further includes other advantages. First, the formations of the source/drain regions and the well use the same patterned photoresist layer as a mask layer, therefore the process steps are reduced. In addition, since the implantation process for forming the source/drain regions is performed prior to the threshold voltage adjustment step, the dopants for the source/drain regions can be activated by the subsequent thermal process such as the step of forming the gate dielectric layer. Consequently, additional thermal process is not required for activating the dopants, so that the process is significantly simplified and the thermal budget is significantly reduced. Moreover, the implantation process for forming the source/drain regions is performed prior to the formation of the gate structure, so that, formation of any uneven surface of the device due to stress, can be planarized by the subsequent process, such as the step of removing the conductive layers outside the opening. Hence, the inter-layer dielectric layer is more planar than that of the first embodiment.

Although the aforementioned embodiment illustrates the fabrication of a gate structure, gate structures are by no means the only structure that can be manufactured by the invention. The method can be applied to fabricate other semiconductor devices including, for example, the word lines of a memory device, the gates of a memory device, metal-oxide-semiconductor (MOS) transistors and metallic interconnects.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device, comprising the steps of:
   providing a substrate;
   forming a mask layer over the substrate;
   patterning the mask layer and the substrate to form a first opening in the substrate;
   forming a gate dielectric layer, and a polycide layer inside the first opening sequentially, wherein the polycide layer fills the first opening;
   removing a portion of the polycide layer so that an upper surface of a remainder polycide layer in the first opening is at a level slightly below an upper surface of the substrate and thereby form a second opening;
   forming a cap layer inside the second opening;
   removing the mask layer; and
   forming a source/drain region in the substrate.

2. The method of claim 1, wherein the step of forming the source/drain region is performed after the step of removing the mask layer.

3. The method of claim 1, wherein the step of forming the source/drain region in the substrate is performed before the step of forming the mask layer over the substrate.

4. The method of claim 3, further comprises a step of forming a well region in the substrate before the step of forming source/drain region in the substrate.

5. The method of claim 4, wherein the step of forming the source/drain region and the step of forming the well region in the substrate use the same layer as a implanting mask.

6. The method of claim 1, further comprises a step of forming a well region in the substrate before the step of forming the mask layer on the substrate.

7. The method of claim 1, wherein after the step of forming a mask layer over the substrate, furthermore comprises forming a bottom anti-reflection layer over the mask layer; and the step of patterning the mask layer and the substrate to form a first opening furthermore comprises patterning the bottom anti-reflection layer.

8. The method of claim 1, wherein the polycide layer comprises a polysilicon layer and a refractory metal silicide layer.

9. The method of claim 8, wherein a material constituting the refractory metal silicide layer is selected from a group consisting of tungsten silicide, nickel silicide, cobalt silicide, titanium silicide, molybdenum silicide, platinum silicide and palladium silicide.

10. The method of claim 1, wherein the step of removing a portion of the polycide layer comprises:
    performing a chemical-mechanical polishing process to remove a portion polycide layer outside the first opening; and
    etching back the remainder polycide layer in the first opening until an upper surface of a remaining polycide layer in the first opening are at a level slightly below the upper surface of the substrate of the substrate and thereby form a second opening.

11. The method of claim 1, wherein the mask layer is fabricated using a material having an etching selectivity that differs from the material constituting the first conductive layer, the second conductive layer and the cap layer.

12. The method of claim 1, wherein after the step of patterning the mask layer and the substrate to form the opening further comprises performing a threshold voltage adjustment process.

13. The method of claim 1, further comprising:
    forming an inter-layer dielectric layer over the substrate; and
    forming a contact opening in the inter-layer dielectric layer using the cap layer as a self-aligned mask.

14. A method of manufacturing a semiconductor device, comprising the steps of:
    forming an opening in a substrate;
    forming a doped polysilicon layer over the sidewalls of the opening; and
    forming a polycide layer over the doped polysilicon layer inside the opening such that an upper surface of the polycide layer is lower than a top surface of the substrate, wherein sidewalls of the polycide layer is enclosed by the doped polysilicon layer.

15. The method of claim 14, wherein the polycide layer comprises a polysilicon layer and a refractory metal silicide layer.

16. The method of claim 15, wherein a material constituting the refractory metal silicide layer is selected from a group consisting of tungsten silicide, nickel silicide, cobalt silicide, titanium silicide, molybdenum silicide, platinum silicide and palladium silicide.

17. The method of claim 1, wherein the step of forming the polycide layer comprises:
    sequentially forming a polysilicon layer and a refractory metal silicide layer over the doped polysilicon layer and filling the opening;
    performing a chemical-mechanical polishing process to remove portions of the polysilicon layer and the refractory metal silicide layer outside the opening; and
    etching back the remainder portions of the polysilicon layer and the refractory metal silicide layer in the opening until an upper surface of a remaining portions the polysilicon layer and the refractory metal silicide layer in the opening layer in the opening are at a level below the upper surface of the substrate.

* * * * *